DIGITAL AFC

Filed June 4, 1968 2 Sheets-Sheet 1

INVENTOR
PAUL H. GROBERT
BY
Menotti J. Lombardi
ATTORNEY

March 24, 1970 P. H. GROBERT 3,503,003

DIGITAL AFC

Filed June 4, 1968 2 Sheets-Sheet 2

INVENTOR
PAUL H. GROBERT
BY [signature]
ATTORNEY

United States Patent Office 3,503,003

Patented Mar. 24, 1970

3,503,003

DIGITAL AFC

Paul H. Grobert, Nutley, N.J., assignor to International Telephone and Telegraph Corporation, Nutley, N.J., a corporation of Delaware Filed June 4, 1968, Ser. No. 734,314

Int. Cl. H03b 3/04

U.S. Cl. 331—17 10 Claims

ABSTRACT OF THE DISCLOSURE

An automatic frequency control circuit wherein the slope of a sawtooth wave is proportional to the frequency difference between a voltage controlled oscillator being controlled and a crystal reference oscillator. The sign of the slope of the wave indicates whether the controlled oscillator is higher or lower than the reference frequency.

BACKGROUND OF THE INVENTION

In general this invention relates to an automatic frequency control circuit and more particularly to an arrangement for frequency locking the voltage controlled oscillator to a reference frequency.

This arrangement utilizes digital techniques and devices rather than analog circuitry presently used in automatic frequency control systems. The advantage of digital techniques for AFC is that it permits the use of standard monolithic integrated circuits for much of the circuitry required. In addition, the method of frequency locking the control oscillator according to the invention is different from the conventional discriminator type or chopper type of automatic frequency control systems.

SUMMARY OF THE INVENTION

Therefore, it is an object of this invention to provide a frequency locking arrangement for a voltage controlled oscillator using digital circuit techniques.

According to the broader aspects of the arrangement, the circuit includes a flip-flop having the voltage controlled oscillator and the reference oscillator coupled to its input. The output of the flip-flop is a pulse train where the pulses become narrower with time when the frequency of the voltage controlled oscillator is higher than the frequency of the reference oscillator. The output pulse train of the flip-flop becomes wider with time when the frequency of the voltage controlled oscillator is lower than the frequency of the reference oscillator. The pulse train includes an abrupt change in pulse width, the repetition rate of this change is the difference frequency between the voltage controlled oscillator and the reference oscillator. The pulse train is then integrated to produce a sawtooth wave form which in turn is differentiated and filtered to obtain the correction voltage for the controlled oscillator.

BRIEF DESCRIPTION OF THE DRAWINGS

The features of the invention will be more easily understood if the following description is taken in connection with the accompanying drawings in which.

DESCRIPTION OF THE PREFERRED EMBODIMENT

Figure 1:
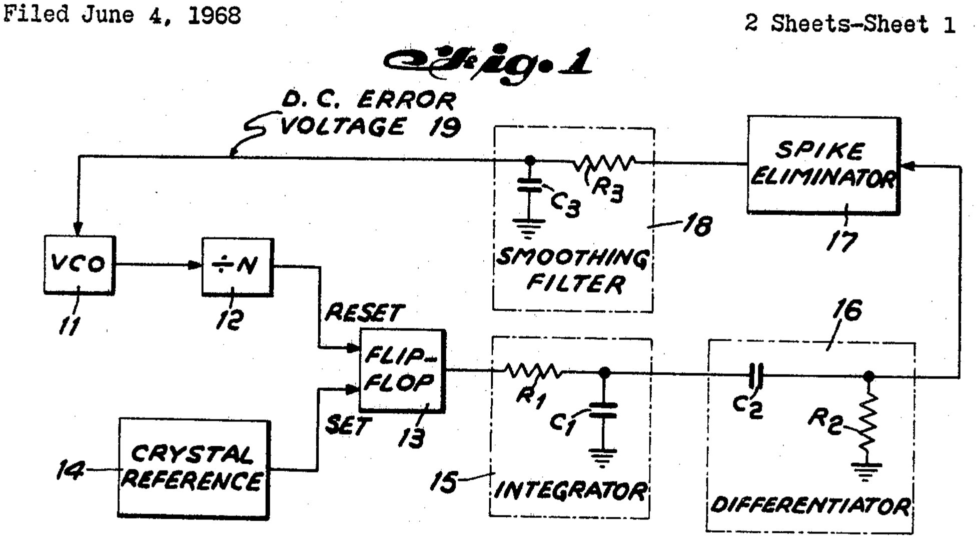
FIGURE 1 shows the basic arrangement according to the invention.

The output of a voltage controlled oscillator 11 coupled to a divider 12 (÷N) whose output is coupled to the reset input of a flip-flop 13. A crystal reference oscillator 14 produces a reference frequency signal which is coupled to the set input of the flip-flop 13. The output from the flip-flop is coupled to an integrator 15 comprising a resistor $R_1$ and capacitor $C_1$. The output from integrator 15 is coupled to a differentiator 16 which includes resistor $R_2$ and capacitor $C_2$. Differentiator 16 feeds its output to a "spike" elimination circuit 17 the output of which is passed through a smoothing filter 18 comprising resistor $R_3$ and capacitor $C_3$ to produce the DC error voltage which, via line 19, is feedback coupled to control frequency output of oscillator 11.

The voltage controlled oscillator is divided down in frequency in order that the flip-flop may be presented with a repetition rate that it can respond to. The reference oscillator repetition rate is the same as that of the divide by N output. Thus if the VCO is exactly on frequency, the divider output rate will be exactly the same as the reference frequency rate.

Figure 2:
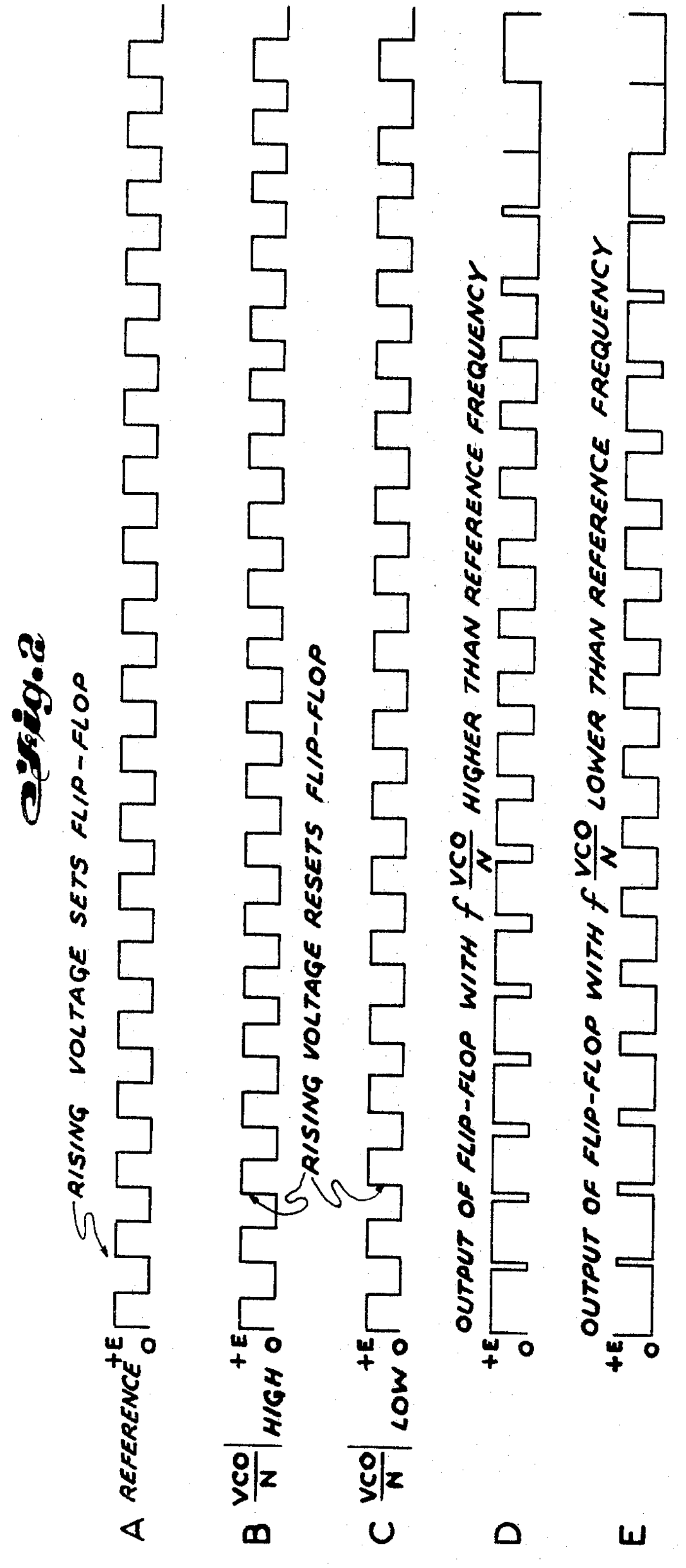
FIGURE 2 shows various waveforms which are helpful in understanding the flip-flop arrangement shown in FIGURE 1.

The unique properties of this AFC arrangement may be best explained and understood by references to FIGURE 2. FIGURE 2A illustrates the output waveform from the crystal reference oscillator 14 wherein the rising voltage portion of the pulse sets the flip-flop. The train of pulses shown in FIGURES 2B and C represents the outputs from the divider 12 both in a condition in which the output frequency is higher than the crystal reference frequency as in 2A and in which the frequency is lower than the reference frequency as in 2B. The rising portion of these voltage trains reset the flip-flop 13. FIGURES 2D and E represent the outputs of the flip-flop 13. When the output frequency of the divider is higher than the reference frequency the result is as shown in FIGURE 2D, when the output frequency from the divider is lower than the reference frequency, the result is as shown in FIGURE 2E.

FIGURE 2 illustrates that the frequency of the signal from the controlled oscillator may be higher or lower than the crystal reference frequency; and that the flip-flop only responds to the positive going signals. The divider output is applied to the reset side of the flip-flop while the crystal reference output signal is applied to the set side of the flip-flop. The flip-flop output as shown in 2D and E is a pulse train that varies in duty cycle from one pulse to the next. For the case where the frequency of the VCO is higher than the reference, the pulses become narrow with increasing time. For the case where the frequency of the VCO is lower than the reference oscillator, the pulses become wider with time, notice, that there is an abrupt change in pulse width from very wide to very narrow or the reverse. The repetition rate of this abrupt change is the difference frequency between the frequency from the output of the divider and the reference frequency. Therefore, the average DC value contained in the pulse train at any instant of time is proportional to the pulse width at that instant of time. In FIGURE 3A, there is illustrated the integrated result of the pulse when the frequency output of the divider is lower than the reference frequency and the slope of the pulse is in a positive direction with the fall time approximately equal to $R_1$, $C_1$ of the integrator 14. Each sawtooth has a width time "$t$" and the slope of a sawtooth is proportional to the frequency difference with the sign of the slope indicating whether the VCO is above or below the reference frequency. In FIGURE 3B there is illustrated the sawtooth waveform with a negative slope representing the frequency of the VCO which results from the output of the divider circuit when the VCO is higher than the crystal reference frequency. The output sawtooth waveforms of FIGURES 3A and B are coupled to the differentiator 15 comprising capacitor $C_2$, $R_2$.

Figure 3:
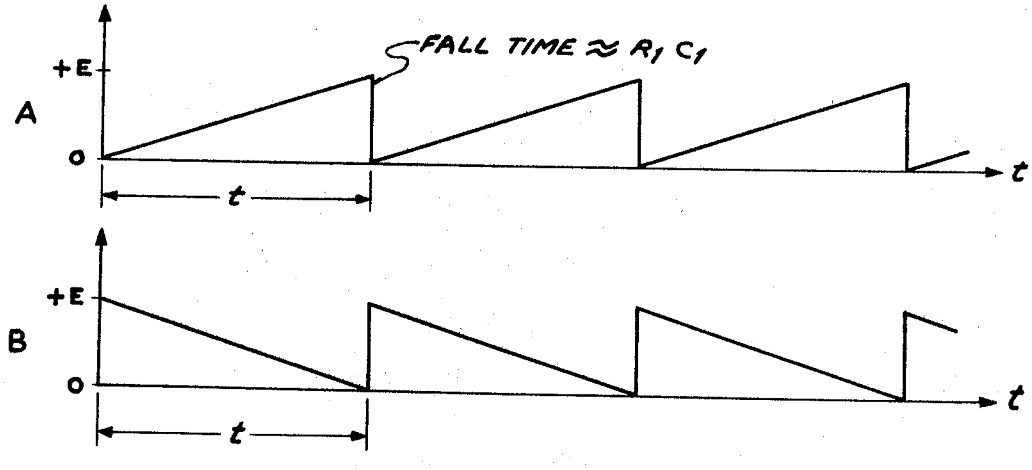
FIGURE 3 illustrates the output waveforms from the integrating circuit of FIGURE 1.
Figure 4:
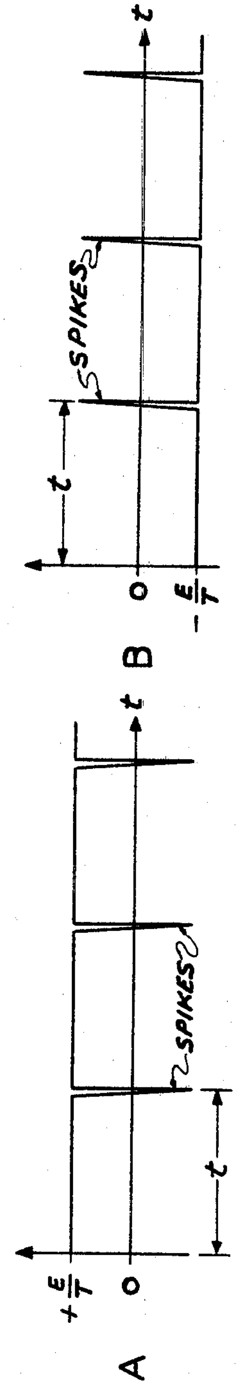
FIGURE 4 illustrates the waveforms in the output of the differentiator circuit of FIGURE 1.

As shown in FIGURES 4A and B, the waveforms of FIGURE 3 is differentiated and the result shown in FIGURE 4. The positive sawtooth waveform of FIGURE 3A produces a DC output with spikes in the differentiator as shown in FIGURE 4A. The waveform shown in FIGURE 4B as having a value of $$-\frac{E}{t}$$

is produced from the negative sloping sawtooth of FIGURE 3B. The spikes shown in FIGURES 4A and B are removed in the eliminator circuit 17 and afterwards passed through the smoothing filter 18. The output is a DC error voltage equal to $$+\frac{E}{t}$$

or $$-\frac{E}{t}$$

as indicated in FIGURE 4, but without the spikes. This control error voltage is fed to the control voltage oscillator to adjust its frequency in the direction appropriate to the slope of the sawtooth which, as indicated, is proportional to the frequency difference between the controlled oscillator and the crystal reference oscillator.

Figure 5:
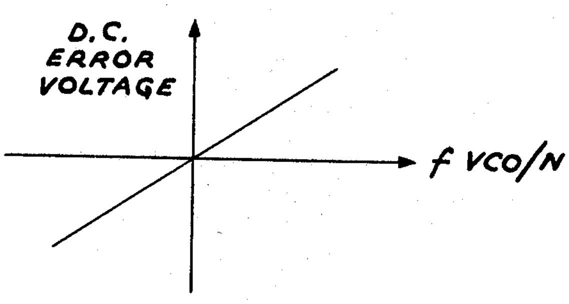
FIGURE 5 is a representation of the DC voltage characteristic obtained according to the inventive arrangement.

After eliminating or reducing the spikes according to standard digital circuit techniques and then smoothing, a DC voltage is obtained which has the characteristic shown in FIGURE 5. In FIGURE 5, the part of the frequency which exists at the output of the divider circuit is plotted on the abscissas and the DC error voltage represented in the ordinant. This produces a straight line error voltage characteristic having a slope which represents a lower oscillator frequency or a higher oscillator frequency.

The digital AFC circuit provides an arrangement for frequency locking the voltage controlled oscillator by means of the slope of a sawtooth which is proportional to the frequency difference between a voltage control oscillator being controlled and a crystal reference oscillator, with the sign of the slope of the sawtooth indicating whether the voltage controlled oscillator is higher or lower than the reference frequency.

I claim:

1. In a digital AFC circuit, an arrangement for frequency locking a voltage controlled oscillator comprising:

- a divider coupled to the output of said voltage controlled oscillator;
- a flip-flop having one input coupled to the output of said divider;
- means for providing a reference frequency to the other input of said flip-flop;
- integrating means coupled to the output of said flip-flop to produce a sawtooth wave whose slope is proportional to the frequency difference between said voltage control oscillator and reference means, with the sign of the slope corresponding to whether said control oscillator is above or below the reference frequency;
- differentiator means coupled to the output of said integrating means to differentiate said sawtooth wave; and
- means coupled to said differentiator to feed back an error voltage which is proportional to the difference between the voltage controlled oscillator frequency and the reference frequency.

2. The arrangement of claim 1 wherein said feedback coupling means includes a spike eliminator circuit and a smoothing filter cooperating together to remove the spike from the output of the differentiating circuit and to produce a DC error voltage for adjusting the output frequency of the voltage controlled oscillator.

3. The arrangement of claim 2 wherein the reference frequency is the same as the divider output frequency, so that if the voltage controlled oscillator is at its proper frequency, the divider output frequency will be exactly the reference rate.

4. The arrangement of claim 3 wherein the output of said flip-flop is a pulse train, the average DC value of which is at any instant of time proportional to the pulse width at that instant of time.

5. The arrangement of claim 4 wherein said means for producing a reference frequency is a crystal oscillator.

6. In a digital AFC circuit the combination of:

- a voltage controlled oscillator;
- a divider coupled to the output of said voltage controlled oscillator;
- a flip-flop coupled to the output of said divider to be reset by a positive going pulse from said divider;
- means for providing a reference frequency, the positive going pulse of which sets said flip-flop;
- integrating means coupled to the output of said flip-flop to produce a sawtooth wave whose slope is proportional to the frequency difference between said voltage controlled oscillator and reference means, with the sign of the slope corresponding to whether said control oscillator is above or below the reference frequency;
- differentiator means coupled to the output of said integrating means to differentiate said sawtooth wave; and
- means coupled to said differentiator to feed back an error voltage whose sign and magnitude is proportional to the difference between the voltage control oscillator frequency and the reference frequency.

7. The arrangement of claim 6 wherein said feedback coupling means includes a spike eliminator circuit and a smoothing filter.

8. The arrangement of claim 7 wherein the reference frequency is the same as the divider output frequency, so that if the voltage controlled oscillator is in its proper frequency, the divider output frequency will be at the rate of the reference frequency.

9. The arrangement of claim 8 wherein the output of said flip-flop is a pulse train the average DC value of which is at any instant of time proportional to the pulse width at that instant of time.

10. The arrangement of claim 9 wherein said means for producing a reference frequency is a crystal oscillator.

References Cited

UNITED STATES PATENTS

| | | | |
|---|---|---|---|
| 3,231,829 | 1/1966 | Reid | 331—27 |
| 3,337,813 | 8/1967 | Graeve | 331—27 |

JOHN KOMINSKI, Primary Examiner

U.S. Cl. X.R.

331—27